United States Patent
Ando et al.

(10) Patent No.: US 10,529,815 B2
(45) Date of Patent: Jan. 7, 2020

(54) CONFORMAL REPLACEMENT GATE ELECTRODE FOR SHORT CHANNEL DEVICES

(71) Applicants: INTERNATIONAL BUSINESS MACHINES CORPORATION, Armonk, NY (US); ULVAC, Inc., Kanagawa (JP)

(72) Inventors: Takashi Ando, Tuckahoe, NY (US); Ruqiang Bao, Niskayuna, NY (US); Masanobu Hatanaka, Susono (JP); Vijay Narayanan, New York, NY (US); Yohei Ogawa, White Plains, NY (US); John Rozen, Hastings on Hudson, NY (US)

(73) Assignees: INTERNATIONAL BUSINESS MACHINES CORPORATION, Armonk, NY (US); ULVAC, INC. (JP)

( * ) Notice: Subject to any disclaimer, the term of this patent is extended or adjusted under 35 U.S.C. 154(b) by 0 days.

(21) Appl. No.: 15/799,231

(22) Filed: Oct. 31, 2017

(65) Prior Publication Data

US 2019/0131418 A1 May 2, 2019

(51) Int. Cl.
*H01L 29/43* (2006.01)
*H01L 29/49* (2006.01)
(Continued)

(52) U.S. Cl.
CPC ............ *H01L 29/435* (2013.01); *B82Y 10/00* (2013.01); *H01L 21/28088* (2013.01);
(Continued)

(58) Field of Classification Search
CPC ....... H01L 21/28088; H01L 21/823842; H01L 29/66545
(Continued)

(56) References Cited

U.S. PATENT DOCUMENTS 8,647,972 B1 2/2014 Ando et al.
8,951,871 B2 2/2015 Mieno
(Continued)

FOREIGN PATENT DOCUMENTS

CN 104979177 A 10/2015
CN 105552116 A 5/2016

OTHER PUBLICATIONS

Ando, T. et al., "Simple gate metal anneal (SIGMA) stack for FinFET replacement metal gate toward 14nm and beyond," Symposium on VLSI Technology (VLSIT), 2014, pp. 54-55.
(Continued)

*Primary Examiner* — David Chen
(74) *Attorney, Agent, or Firm* — Tutunjian & Bitetto, P.C.; Vazken Alexanian (57) ABSTRACT

A gate structure for effective work function adjustments of semiconductor devices that includes a gate dielectric on a channel region of a semiconductor device; a first metal nitride in direct contact with the gate dielectric; a conformal carbide of Aluminum material layer having an aluminum content greater than 30 atomic wt. %; and a second metal nitride layer in direct contact with the conformal aluminum (Al) and carbon (C) containing material layer. The conformal carbide of aluminum (Al) layer includes aluminum carbide, or $Al_4C_3$, yielding an aluminum (Al) content up to 57 atomic % (at. %) and work function setting from 3.9 eV to 5.0 eV at thicknesses below 25 Å. Such structures can present metal gate length scaling and resistance benefit below 25 nm compared to state of the art work function electrodes.

14 Claims, 4 Drawing Sheets

(51) Int. Cl.
| | |
|---|---|
| H01L 27/092 | (2006.01) |
| H01L 21/285 | (2006.01) |
| H01L 21/28 | (2006.01) |
| H01L 21/8238 | (2006.01) |
| H01L 29/66 | (2006.01) |
| B82Y 10/00 | (2011.01) |
| H01L 29/40 | (2006.01) |
| H01L 29/423 | (2006.01) |
| H01L 29/78 | (2006.01) |
| H01L 29/775 | (2006.01) |
| H01L 29/06 | (2006.01) |

(52) U.S. Cl.
CPC ........... *H01L 21/28568* (2013.01); *H01L 21/823821* (2013.01); *H01L 21/823842* (2013.01); *H01L 27/0924* (2013.01); *H01L 29/401* (2013.01); *H01L 29/42372* (2013.01); *H01L 29/4966* (2013.01); *H01L 29/66545* (2013.01); *H01L 29/0673* (2013.01); *H01L 29/66795* (2013.01); *H01L 29/775* (2013.01); *H01L 29/785* (2013.01)

(58) Field of Classification Search
USPC ........... 257/288, E21.161, E29.255; 438/283
See application file for complete search history.

(56) References Cited

U.S. PATENT DOCUMENTS

| | | | |
|---|---|---|---|
| 9,240,453 B2 | 1/2016 | Oh | |
| 9,349,733 B2 | 5/2016 | Chang et al. | |
| 9,620,610 B1 | 4/2017 | Jangjian et al. | |
| 2006/0237801 A1 | 10/2006 | Kavalieros et al. | |
| 2009/0039440 A1* | 2/2009 | Hokazono | H01L 21/823835 257/372 |
| 2013/0217220 A1* | 8/2013 | Jagannathan | H01L 21/82382 438/592 |
| 2014/0112824 A1* | 4/2014 | Thompson | C23C 16/30 420/580 |
| 2015/0054029 A1* | 2/2015 | Jangjian | H01L 29/4966 257/190 |
| 2015/0228730 A1* | 8/2015 | Yang | H01L 27/092 257/369 |
| 2016/0163603 A1 | 6/2016 | Bao et al. | |

OTHER PUBLICATIONS

Bao, R. et al., "Replacement metal gate resistance in FinFET architecture modelling, validation and extendibility" International Electron Devices Meeting (IEDM) (Dec. 2015) pp. 883-886.

Gilmer, D.C. et al., "Strained SiGe Channels for Band-Edge PMOS Threshold Voltages With Metal Gates and High-k Dielectrics" IEEE Transactions on Electron Devices (Apr. 2010) pp. 898-904, vol. 57, No. 4.

Hinkle, C.L. et al., "Dipole controlled metal gate with hybrid low resistivity cladding for gate-last CMOS with low Vt" Symposium on VLSI Technology (VLSIT) (Jun. 2010) pp. 183-184.

Kwon, U. et al., "A novel low resistance gate fill for extreme gate length scaling at 20nm and beyond for gate-last high-k/metal gate CMOS technology" Symposium on VLSI Technology (VLSIT) (Jun. 2012) pp. 29-30.

Ragnarsson, L.A. et al., "Highly scalable bulk FinFET Devices with Multi-V T options by conductive metal gate stack tuning for the 10-nm node and beyond" Symposium on VLSI Technology (VLSIT) (Jun. 2014) pp. 56-57.

International Search Report and Written Opinion issued in PCT/IB2018/057929, dated Jan. 18, 2019, pp. 1-9.

* cited by examiner

CONFORMAL REPLACEMENT GATE ELECTRODE FOR SHORT CHANNEL DEVICES

BACKGROUND

Technical Field

The present invention generally relates to semiconductor devices, and more particularly to semiconductor devices that are manufactured using replacement gate process flows.

Description of the Related Art

Field effect transistors (FETs) are widely used in the electronics industry for switching, amplification, filtering and other tasks related to both analog and digital electrical signals. Most common among these are metal oxide semiconductor field effect transistors (MOSFET or MOS), in which a gate structure is energized to create an electric field in an underlying channel region of a semiconductor body, by which electrons are allowed to travel through the channel between a source region and a drain region of the semiconductor body. Continuing trends in semiconductor device manufacturing include a reduction in electrical device feature size (scaling), as well as improvements in device performance in terms of device switching speed and power consumption.

SUMMARY

The present invention can provide a conformal replacement gate electrode including a carbide of aluminum separated from the gate dielectric by a diffusion barrier layer. The conformal carbide of aluminum (Al) layer includes aluminum carbide, or $Al_4C_3$, yielding an aluminum (Al) content up to 57 atomic % (at. %) and work function setting from 3.9 eV to 5.0 eV at thicknesses below 25 Å (angstrom). Such structures can present metal gate length scaling and resistance benefit below 25 nm compared to state of the art work function electrodes.

In one embodiment, a gate structure is provided that includes a carbide of aluminum material layer, which provides effective work function adjustments in semiconductor devices. In one embodiment, the material layer is $Al_4C_3$ layer. In another embodiment, the material is a composite of $Al_4C_3$ and Ti-containing carbide of aluminum (Al). In another embodiment, the gate structure for effective work function adjustments of semiconductor devices includes a gate dielectric on a channel region of a semiconductor device. The gate structure can also include a first metal nitride in direct contact with the gate dielectric; a conformal carbide of aluminum (Al) material layer having an aluminum (Al) content greater than 30 at. %; and a second metal nitride layer in direct contact with the conformal carbide of aluminum (Al) material layer. In some embodiments, the conformal carbide of aluminum (Al) material layer has a thickness that is between 5 Å (angstrom) and 20 Å.

In another embodiment, a semiconductor device is provided that includes a gate structure having a carbide of aluminum material layer, which provides effective work function adjustments for the semiconductor device. In one embodiment, the material layer is $Al_4C_3$ layer. In another embodiment, the material is a composite of $Al_4C_3$ and Ti-containing carbide of aluminum. In another embodiment, the semiconductor device includes source and drain regions on opposing sides of a channel region of the semiconductor device; and a gate structure comprising a gate dielectric on a channel region of a semiconductor device. The gate structure may further include a first metal nitride in direct contact with the gate dielectric, a conformal carbide of aluminum (Al) material layer having an aluminum content greater than 30 at. %, and a second metal nitride layer in direct contact with the conformal carbide of aluminum (Al) material layer. The conformal carbide of aluminum (Al) material layer provides for effective work function adjustments of the semiconductor device. The semiconductor device may be selected from the group consisting of a planar semiconductor device, a fin type field effect transistor (Fin-FET), a horizontal gate all around (GAA) semiconductor device like nanosheet and nanowire semiconductor device, a vertical gate all around (GAA) semiconductor device and a combination thereof. In one embodiment, the metal gate length can be shorter than 25 nm, and in some instances can be as short as 4 nm.

In yet another embodiment, a method of forming a gate structure for effective work function (eWF) between 3.9 eV and 5 eV is provided that includes forming a gate opening to a semiconductor channel region; and forming a high-k gate dielectric layer on the semiconductor channel region. An effective work function adjusting gate stack may then be formed on the high-k gate dielectric layer, wherein the effective work function adjusting gate stack may include a sequence of a first metal nitride layer, a carbide of aluminum material layer, and a second metal nitride layer, wherein each layer of the effective work function adjusting layer is deposited using a conformal atomic layer deposition process.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The terms "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

Replacement gate Fin type field effect transistors (FinFETs) have previously employed conformal deposition of a tunable work function (WF) setting metal in a trench. In some scenarios, effective WF (eWF) setting through the electrode is preferred over tuning the channel doping for fully depleted devices, and small three dimensional channels thereby reducing variability. Gate length in a replacement metal gate (RMG) flow is physically limited by the space needed in the trench for the effective work function (eWF) adjusting electrode, and for the high-conductivity metal fill. It has been determined that further scaling of the gate length can be required in future technology nodes to keep up with Moore's law. Additionally, in some embodiments, process sequences for increasing scaling must be enabled in part by a thinner less resistive effective work function (eWF) adjusting electrode/fill metal stack. Further, there is a need to provide effective work function (eWF) adjusting electrodes to germanium (Ge)-containing short channel p-type field effect transistors (pFETs), as the increase of germanium (Ge) content to boost mobility also makes threshold voltages more positive, when compared to silicon (Si) channel devices.

In some embodiments, the methods and structures that are described herein provide a thinner more efficient conformal effective work function (eWF) setting stack for complementary metal oxide semiconductor (CMOS) control threshold voltage control than what could previously be provided. In accordance with some embodiments of the present disclosure, the material layer stacks for the gate structure providing the effective work function (eWF) adjustment may include a material layer including aluminum (Al) in atomic percent greater than 30 at. %, which in some examples can be greater than 50 at. %, such as 57 at. %. In some embodiments, in which the gate stack for effective work function (eWF) adjustments include a carbide of aluminum (Al) material layer, the aluminum to carbon (Al/C) ratio can be over 0.5, and in some examples can be over 1.0. In some embodiments, the methods and structures provided herein can provide a carbide of aluminum material layer within a gate stack for adjusting the effective work function (eWF) of a device having a thickness of less than 25 Å, and in some examples less than 10 Å. In some embodiments, using the methods and structures described herein can provide a gate stack having a plurality of layers for providing effective work function (eWF) adjustments, in which the plurality of layers for the effective work function (eWF) adjustments has a thickness that is no greater than 50 nm. As will be discussed in greater detail below, the deposition of the aluminum and carbon containing material layer may be provided by decoupling the aluminum (Al) and carbon (C) sources, which allows for a more potent Al-containing layer. In some embodiments, the conformal Al-containing ALD layers enabling reduction of the eWF. In some embodiments, then aluminum (Al) generates positive charge in the oxide while its diffusion towards the channel is inhibited by the bottom TiN layer, mitigating gate leakage current.

Figure 1:
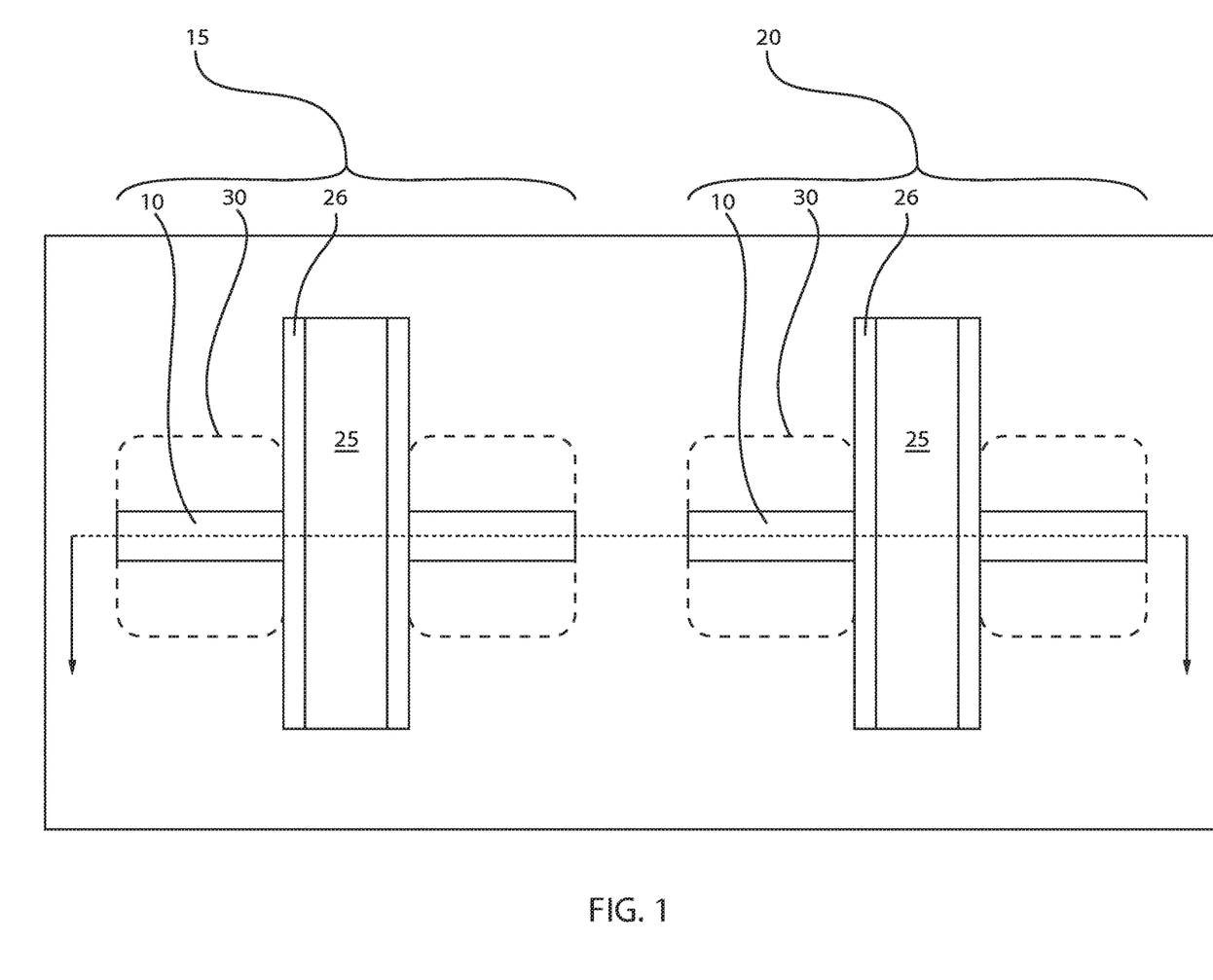
FIG. 1 is a top down view of a sacrificial gate structure on fin structures, in accordance with one embodiment of the present invention.
Figure 2:
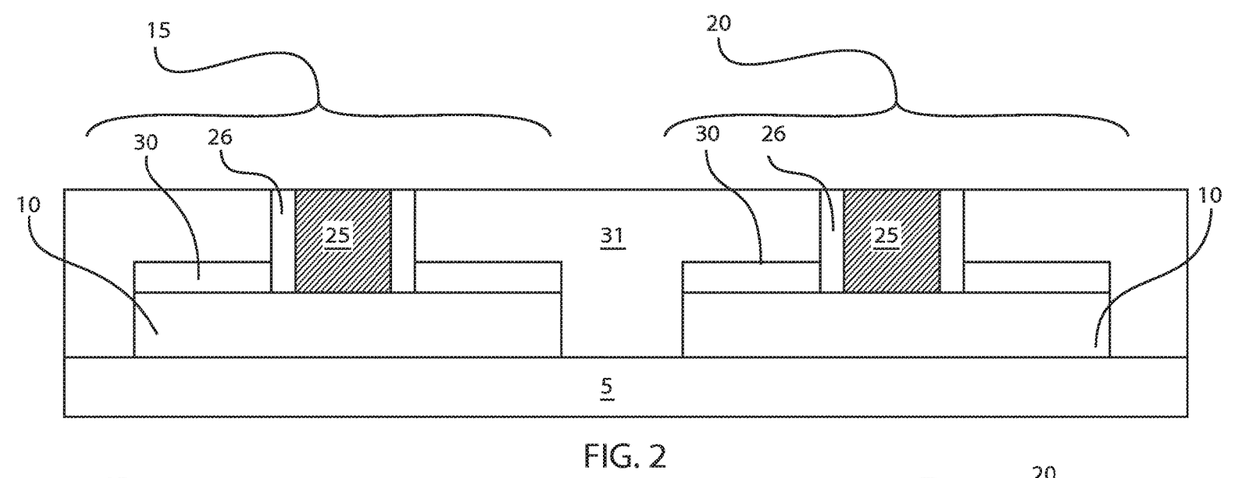
FIG. 2 is a side cross-sectional view of the structure depicted in FIG. 1 including the sacrificial gate structures on the fin structures along section line A-A.

FIGS. 1 and 2 depict a sacrificial gate structure 25 on fin structures 10, which can provide one of the initial structures for providing gate structures having aluminum (Al) and carbon (C) containing material layers for effective work function (eWF) adjustments of the semiconductor devices. The work function is the minimum thermodynamic work (i.e. energy) needed to remove an electron from a solid to a point in the vacuum immediately outside the solid surface. In some embodiments, the aluminum (Al) and carbon (C) containing material layer provides an n-type threshold voltage shift. "N-type threshold voltage shift" as used herein means a shift in the Fermi energy of an n-type semiconductor device towards a conduction band of silicon in a silicon-containing substrate of the n-type semiconductor device. The "conduction band" is the lowest lying electron energy band of the doped material that is not completely filled with electrons.

In the embodiments depicted in FIGS. 1-7, the semiconductor devices being formed are field effect transistors. A field effect transistor (FET) is a semiconductor device in which output current, i.e., source-drain current, is controlled by the voltage applied to a gate structure to the semiconductor device. A field effect transistor has three terminals, i.e., gate structure, source region and drain region. As used herein, a "fin structure" refers to a semiconductor material, which is employed as the body of a semiconductor device, in which the gate structure is positioned around the fin structure such that charge flows down the channel on the two sidewalls of the fin structure and optionally along the top surface of the fin structure. A finFET is a semiconductor device that positions the channel region of the semiconductor device in a fin structure. The source and drain regions of the fin structure are the portions of the fin structure that are on opposing sides of the channel region of the fin structure. Although, the structures depicted in FIGS. 1-7 are FinFETs, the methods and structures provided herein are not limited to only providing effective work function (eWF) adjusting gate structures for use in FinFET type devices. Other semiconductor devices are equally applicable to the methods and structures described herein, such as planar semiconductor devices, e.g., metal oxide field effect transistors (MOSFETs); three dimensional (3D) channel semiconductor devices; nanosheet semiconductor devices; vertical field effect transistors (VFET), and other semiconductor devices.

Referring to FIGS. 1 and 2, depict one embodiment of forming a plurality of fin structures 10 present atop a substrate 5 for providing semiconductor devices. In some embodiments, at least one fin structure 10 may be present in an n-type region 15 of the substrate 5, and at least one fin structure 10 may be present in a p-type region 20 of the substrate 5.

The fin structures 10 provide the channel region of the semiconductor device. In some embodiments, the fin structures 10 may be composed of a type IV semiconductor. By "type IV semiconductor" it is meant that the semiconductor material includes at least one element from Group IVA (i.e., Group 14) of the Periodic Table of Elements. Examples of type IV semiconductor materials that are suitable for the fin structure include silicon (Si), germanium (Ge), silicon germanium (SiGe), silicon doped with carbon (Si:C), silicon germanium doped with carbon (SiGe:C) and a combination thereof. In one example, at least one of the fin structures 10 in the n-type region 15 and the p-type region 20 may be composed of silicon (Si), e.g., single crystal silicon. In some embodiments, the material for the fin structure 10 may include greater than 95 at. % silicon, and can be substantially pure silicon, e.g., 99 at. % silicon or greater. In some examples, the fin structures 10 may have a base material composition that is 100 at. % silicon.

In another embodiment, at least one of the fin structures 10 in the n-type region 15 and the p-type region 20 may be composed of germanium (Ge) containing semiconductor material. In some embodiments, the material layer for the at least one first fin structure may be composed of silicon germanium (SiGe). In some embodiments, the material layer for the fin structures 10 may be composed of silicon germanium (SiGe) or germanium (Ge). For example, the material layer for the fin structure 10 may be composed of up to 99 at. % germanium. In one embodiment, the material layer for the fin structure comprises from 1 at. % germanium to 99 at. % germanium. In another embodiment, the material layer for the fin structure is composed of 10 at. % to 50 at. % germanium.

In other embodiments, at least one of the fin structures 10 in the n-type region 15 and the p-type region 20 may be composed of a type III-V semiconductor material. The term "III-V semiconductor material" denotes a semiconductor material that includes at least one element from Group IIIB of the Periodic Table of Elements under the Old International Union of Pure and Applied Chemistry (IUPAC) classification system, or Group 13 of the New International Union of Pure and Applied Chemistry classification system; and at least one element from Group VB of the Periodic Table of Elements, or Group 15 of the New International Union of Pure and Applied Chemistry classification system. In some embodiments, the III-V semiconductor material that provides the fin structures 10 may be selected from the group of (AlSb), aluminum arsenide (AlAs), aluminum nitride (AlN), aluminum phosphide (AlP), gallium arsenide (GaAs), gallium phosphide (GaP), indium antimonide (InSb), indium arsenic (InAs), indium nitride (InN), indium phosphide (InP), aluminum gallium arsenide (AlGaAs), indium gallium phosphide (InGaP), aluminum indium arsenic (AlInAs), aluminum indium antimonide (AlInSb), gallium arsenide nitride (GaAsN), gallium arsenide antimonide (GaAsSb), aluminum gallium nitride (AlGaN), aluminum gallium phosphide (AlGaP), indium gallium nitride (InGaN), indium arsenide antimonide (InAsSb), indium gallium antimonide (InGaSb), aluminum gallium indium phosphide (AlGaInP), aluminum gallium arsenide phosphide (AlGaAsP), indium gallium arsenide phosphide (InGaAsP), indium arsenide antimonide phosphide (InArSbP), aluminum indium arsenide phosphide (AlInAsP), aluminum gallium arsenide nitride (AlGaAsN), indium gallium arsenide nitride (InGaAsN), indium aluminum arsenide nitride (InAlAsN), gallium arsenide antimonide nitride (GaAsSbN), gallium indium nitride arsenide aluminum antimonide (GaInNAsSb), gallium indium arsenide antimonide phosphide (GaInAsSbP), and combinations thereof.

The fin structures 10 may be formed using deposition, photolithography and etch processes. In one embodiment, the patterning process used to define each of the fin structures 10 is a sidewall image transfer (SIT) process. The SIT process can include forming a mandrel material layer (not shown) on the portions of a semiconductor material, e.g., layer and/or substrate that provides the fin structures 10. The mandrel material layer can include any material (semiconductor, dielectric or conductive) that can be selectively removed from the structure during a subsequently performed etching process. In one embodiment, the mandrel material layer may be composed of amorphous silicon or polysilicon. In another embodiment, the mandrel material layer may be composed of a metal, such as, e.g., aluminum (Al), tungsten (W), or copper (Cu). The mandrel material layer can be formed by a deposition method, such as chemical vapor deposition or plasma enhanced chemical vapor deposition. Following deposition of the mandrel material layer, the mandrel material layer can be patterned by lithography and etching to form a plurality of mandrel structures on the topmost surface of the semiconductor containing material that provides the fin structures 10.

In some embodiments, the SIT process may continue by forming a dielectric spacer on each sidewall of each mandrel structure. The dielectric spacer can be formed by deposition of a dielectric spacer material, and then etching the deposited dielectric spacer material. The dielectric spacer material may comprise any dielectric spacer material such as, for example, silicon dioxide, silicon nitride or a dielectric metal oxide. Examples of deposition processes that can be used in providing the dielectric spacer material include, but are not limited to, chemical vapor deposition (CVD), plasma enhanced chemical vapor deposition (PECVD), or atomic layer deposition (ALD). Examples of etching that be used in providing the dielectric spacers include any etching process such as, e.g., reactive ion etching (RIE). Since the dielectric spacers are used in the SIT process as an etch mask, the width of the each dielectric spacer determines the width of each fin structure 10.

In some embodiments, after formation of the dielectric spacers, the SIT process continues by removing each mandrel structure. Each mandrel structure can be removed by an etching process that is selective for removing the mandrel material as compared to silicon. Following the mandrel structure removal, the SIT process continues by transferring the pattern provided by the dielectric spacers into the portion of the semiconductor material provides the fin structures 10. The pattern transfer may be achieved by utilizing at least one etching process that can include dry etching, such as reactive ion etching (RIE), plasma etching, ion beam etching or laser ablation, chemical wet etch processes or a combination thereof. Following etching, i.e., pattern transfer, the SIT process may conclude with removing the dielectric spacers using an etch process or a planarization process. It is noted that the aforementioned spacer image transfer (SIT) process is only one method of forming the fin structures 10. In another embodiment, each of the fin structures 10 may be formed using a photoresist etch mask.

FIGS. 1 and 2 further depict forming sacrificial gate structures 25 on the channel portion of the fin structures 10. The sacrificial gate structures 25 are composed of a material that may be removed selectively to the underlying active region, in which the geometry of the sacrificial gate structures 25 dictates the later formed functional gate structures. The sacrificial gate structures 25 may be replaced using a replacement metal gate (RMG) process flow. In some embodiments, the sacrificial gate structures 25 may be composed of a semiconductor material, such as silicon (Si), e.g., amorphous silicon or polysilicon.

Following the formation of the sacrificial gate structures 25, source and drain regions 30 may be formed in each of the active regions. A sidewall spacer dielectric film 26 is deposited over all structures and etched back to expose the source/drain epitaxy surface. The source and drain regions 30 may be formed by ion implantation or by forming an in-situ doped epitaxial semiconductor material. For example, when the active regions include fin structures, the source and drain regions 30 may be formed by epitaxially forming in situ doped semiconductor material on the portions of the fin structures that are on opposing sides of the channel region of the fin structures. Sequential spacer deposition, patterning, etch-back and implantation processes can be completed for both NFET and PFET devices to form CMOS based logic circuits.

Following formation of the source and drain regions 30, an interlevel dielectric layer 31 is formed between and over the sacrificial gate structures 25, the fin structures 10, and the source and drain regions 30. The interlevel dielectric layer 31 may be formed using a deposition method, such as chemical vapor deposition (CVD), e.g., plasma enhanced chemical vapor deposition (PECVD), deposition from chemical solution, or spin on deposition. Following deposition, the interlevel dielectric layer 31 is planarized, e.g., planarized by chemical mechanical planarization (CMP), so that the upper surface of the interlevel dielectric layer 31 is coplanar with the upper surface of the sacrificial gate structures 25.

Figure 3:
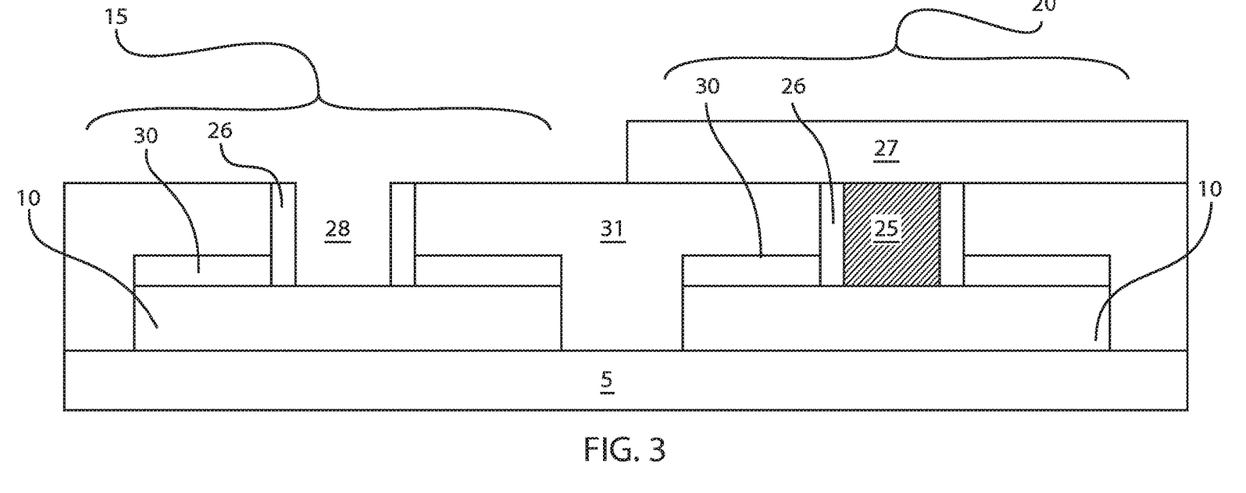
FIG. 3 is a side cross-sectional view of forming a block mask over one region of the substrate including one sacrificial gate structure, and removing an exposed sacrificial gate structure that is not present underlying the block mask

FIG. 3 depicts one embodiment of forming a block mask 27 over one region 20 of the substrate 5 including one sacrificial gate structure 25, and removing an exposed sacrificial gate structure 25 that is present in another region 15 of the substrate 5 that is not present underlying the block mask 27. The block mask 27 may be a hard mask that is formed from a dielectric material using deposition, photolithography and etch processes. For example, a dielectric layer for the block mask 27, such as a nitride or oxide material layer, may be blanked deposited atop the interlevel dielectric layer 31 and the upper surfaces of the sacrificial gate structures 25. For example, the dielectric layer for the hard mask 6 may be blanked deposited using a deposition process, such as chemical vapor deposition (CVD), e.g., plasma enhanced chemical vapor deposition (PECVD), chemical solution deposition, spin on deposition or physical vapor deposition. In some examples, the blanket deposited hard mask dielectric layer may be composed of silicon nitride, e.g., Si3N4, silicon oxynitride or silicon oxide.

An etch mask, e.g., photoresist mask, may then be formed on the blanket deposited dielectric layer for the block mask 27. To provide the photoresist mask, a photoresist layer is first positioned on the layer of the dielectric material that block mask 27. The photoresist layer may be provided by a blanket layer of photoresist material that is formed utilizing a deposition process such as, for example, chemical vapor deposition, plasma enhanced chemical vapor deposition, evaporation or spin-on coating. The blanket layer of photoresist material is then patterned to provide the photoresist mask utilizing a lithographic process that may include exposing the photoresist material to a pattern of radiation and developing the exposed photoresist material utilizing a resist developer.

The blanket deposited hard mask layer than may be etched using an etch process that is selective to at least the photoresist mask, wherein the portion of the blanket deposited hard mask layer protected by the photoresist mask remain to provide the hard mask 6 and the exposed portions of the blanket deposited hard mask layer are removed. The photoresist mask may then be removed.

FIG. 3 further depicts removing an exposed sacrificial gate structure 25 that is not present underlying the block mask 27. The sacrificial gate structure 25 may be removed using a selective etch process. As used herein, the term "selective" in reference to a material removal process denotes that the rate of material removal for a first material is greater than the rate of removal for at least another material of the structure to which the material removal process is being applied. For example, in one embodiment, a selective etch may include an etch chemistry that removes a first material selectively to a second material by a ratio of 10:1 or greater. In some embodiments, the etch process for removing the exposed sacrificial gate structure 25 is selective to the interlevel dielectric layer 31, the fin structure 10 and the block mask 27.

The block mask 27 that is depicted in FIG. 3 is used to selectively remove sacrificial gate structures 25 in a process sequence for independently forming functional gate structures for each of the first and second device regions 10, 15. It is noted that although FIG. 3 illustrates removing the sacrificial gate structure 25 from the first device region 15, while protecting the sacrificial gate structure 25 in the second device region 20, the sequence may be reversed. For example, the block mask 27 may be formed over the first device region 15, while the sacrificial gate structure 25 is removed from the second device region 20. In other embodiments, the use of a block mask 27 may be omitted, in which the functional gate structures for the first and second device regions 10, 15 may be formed at substantially the same time.

Removing the sacrificial gate structure 25 forms gate openings 28 to the channel regions of the fin structures 10. Functional gate structures 40 are formed in the gate openings. The "functional gate structure" operates to switch the semiconductor device from an "on" to "off" state, and vice versa. The functional gate structure 40 typically includes at least on gate dielectric 41 and at least one gate conductor 42, 43, 44, 45, in which the gate conductor portion includes a material layer that provides an effective work function adjustment.

The effective work (eWF) adjusting gate structures 40 that are formed in the gate openings can be referred to as replacement metal gate (RMG) structures. The effective work function (eWF) adjusting gate structures 40 can include one carbide of aluminum material layer 43, which can be a carbide of aluminum that is referred to herein as AlC. The high aluminum content of the carbide of an aluminum material layer 43 provides for a threshold voltage shift for layer thicknesses below 20 Å, that were previously not possible in conformal replacement gate structure. The increased aluminum content causes a threshold voltage shift that is suitable for n-type semiconductor devices, e.g., n-type finFETs. The carbide of aluminum material layer 43 has a conformal thickness, and is deposited using atomic layer deposition (ALD). As will be described below, the carbide of aluminum material layer 43 can be stacked with metal nitride containing layer 42, 44 to provide a functional gate structure 40 that produces an effective work function (eWF) shift. Some embodiments of effective work function (eWF) adjusting gate structures 40 that can be formed in the gate openings produced using a replacement gate process are depicted in FIGS. 4-7.

It is noted that in each of the following described gate structures, the underlying channel region is free of work function adjusting dopant. In each of the following described structure, the work function of the semiconductor device is adjusted through the material selection and thickness of the layers of the gate structure, e.g., the layers of the gate electrode of the gate structure.

Figure 4:
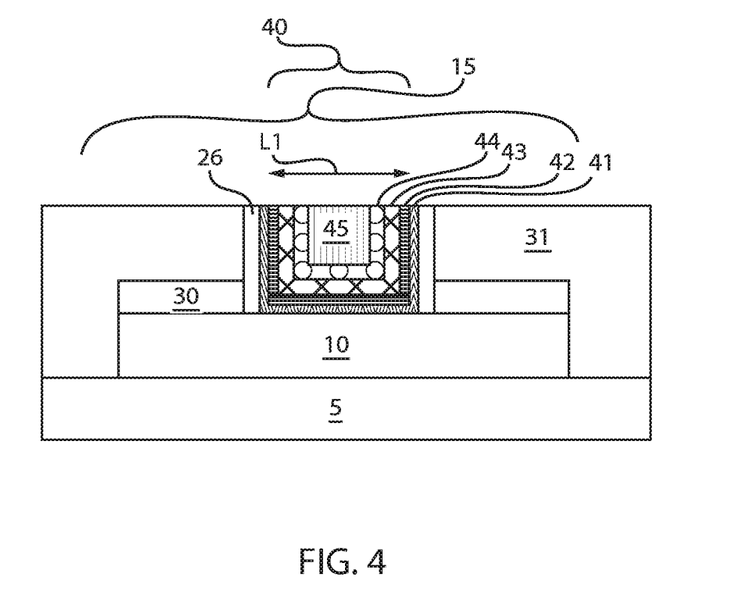
FIG. 4 is a side cross-sectional view of a replacement metal gate structure including a gate stack of a high-k gate dielectric atop a semiconductor channel, a first metal nitride layer atop the high-k gate dielectric, a carbide of aluminum material layer atop the first metal nitride layer, a second metal nitride layer atop the carbide of aluminum material layer, and a metal fill, in accordance with one embodiment of the present invention.

FIG. 4 depicts one embodiment of a replacement metal gate (RMG) structure including a gate stack 40 of a gate dielectric layer 41, e.g., high-k gate dielectric, atop a semiconductor channel (e.g., fin structure 10), a first metal nitride layer 42 atop the high-k gate dielectric 41, a carbide of aluminum material layer 43 atop the first metal nitride layer 42, a second metal nitride layer 44 atop the aluminum and carbon containing material layer 43, and a metal fill 45. The combination of layers first metal nitride layer 42, the carbide of aluminum material layer 43, and the second metal nitride layer 44 constitute a workfunction setting electrode.

In one embodiment, the at least one gate dielectric 41 includes, but is not limited to, an oxide, nitride, oxynitride and/or silicates including metal silicates, aluminates, titanates and nitrides. In one example, when the at least one gate dielectric 41 is comprised of an oxide, such as silicon oxide ($SiO_2$). In one embodiment, the least one gate dielectric layer 41 may be provided by a high-k dielectric material. A high-k dielectric material is a material having a dielectric constant that is greater than the dielectric constant of silicon oxide ($SiO_2$) at room temperature, e.g., 20° C. to 25° C. For example, a high-k dielectric material can have a dielectric constant greater than 4.0. In one embodiment, the least one gate dielectric layer is composed of a high-k oxide such as, for example, $HfO_2$, $ZrO_2$, $Al_2O_3$, $TiO_2$, $La_2O_3$, $SrTiO_3$, $LaAlO_3$, $Y_2O_3$ and mixtures thereof. Other examples of high-k dielectric materials for the at least one gate dielectric layer include hafnium silicate, hafnium silicon oxynitride or combinations thereof.

In some embodiments, the gate dielectric 41 is formed using chemical vapor deposition (CVD) or atomic layer deposition (ALD).

Chemical vapor deposition (CVD) is a deposition process in which a deposited species is formed as a result of chemical reaction between gaseous reactants at greater than room temperature (25° C. to 900° C.); wherein solid product of the reaction is deposited on the surface on which a film, coating, or layer of the solid product is to be formed. Examples of CVD processes for forming the at least one gate dielectric 41 include chemical vapor deposition (CVD), plasma enhanced chemical vapor deposition (PECVD), physical vapor deposition (PVD) and other like deposition processes.

Atomic Layer Deposition (ALD) uses self-limiting surface reactions to deposit material layers in the monolayer or sub-monolayer thickness regime. ALD is similar in chemistry to chemical vapor deposition (CVD), except that the ALD reaction breaks the CVD reaction into two half-reactions, keeping the precursor materials separate during the reaction. In some embodiments, the atomic layer deposition (ALD) process may be a thin film deposition method in which a film is grown on a substrate by exposing its surface to alternate gaseous species (typically referred to as precursors). In contrast to chemical vapor deposition, the precursors are never present simultaneously in the reactor, but they are inserted as a series of sequential, non-overlapping pulses. In each of these pulses the precursor molecules react with the surface in a self-limiting way, so that the reaction terminates once all the reactive sites on the surface are consumed. In some embodiments, the monolayer deposition provided by the atomic layer depositions mechanisms provides that the layer be conformal.

Deposition of the at least one gate dielectric 41, whether by CVD or ALD, may be done in a conformal matter. The term "conformal" denotes a layer having a thickness that does not deviate from greater than or less than 30% of an average value for the thickness of the layer. As depicted in FIG. 4, the gate dielectric 41 is conformally deposited on the horizontally orientated surface, i.e., upper surface, of the channel portion of the fin structure 10 of the gate opening; and the vertically orientated surface of the gate opening provided by the sidewalls of the gate spacer 26. The gate dielectric 41 may have a thickness ranging from 10 Å to 50 Å.

Referring to FIG. 4, the first metal nitride layer 42 is formed in direct contact with the gate dielectric layer 41. In one example, the first metal nitride layer 42 is composed of titanium nitride (TiN). Although titanium nitride (TiN) is one example of a metal nitride composition for the first metal nitride layer 42, the methods and structures described herein are not limited to only this composition. For example, the first metal nitride 42 may also be composed of tantalum nitride (TaN), tungsten nitride (WN) and combinations thereof, which include combinations with titanium nitride (TiN). The thickness of the first metal nitride is between 5 Å and 30 Å, more specifically between 5 Å and 20 Å.

Similar to the gate dielectric 41, the first metal nitride layer 42 is a conformally deposited layer. For example, the portions of the first metal nitride layer 42 that are present at the base of the gate opening are horizontally orientated, and have a substantially same thickness as the portions of the first metal nitride layer 42 that present on the vertically orientated portions of the gate dielectric 41 that are present on the gate sidewall spacer 26. The first metal nitride layer 42, e.g., first titanium nitride layer, may have a thickness ranging from 10 Å to 30 Å. In another embodiment, the first metal nitride layer 42, e.g., first titanium nitride layer, may have a thickness ranging from 5 Å to 20 Å. The first metal nitride layer 42, e.g., first titanium nitride layer, may be deposited using atomic layer deposition (ALD). For example, the first metal nitride layer 42, e.g., titanium nitride layer (TiN), can be deposited using atomic layer deposition (ALD) using gas precursors comprised of $TiCl_4$—$NH_3$ precursors at a temperature ranging from 350° C. to 450° C.

Referring to FIG. 4, the carbide of aluminum material layer 43 is present directly on the first metal nitride layer 42. The carbide of aluminum material layer 43 is a material layer including aluminum (Al) in atomic percent greater than 30 at. %. In some embodiments, the which in some examples can be greater than 50 at. %, more specifically 57 at. %. In some embodiments, in which the gate stack for effective work function (eWF) adjustments include a layer of containing carbide of aluminum material, the aluminum to carbon (Al/C) ratio can be over 0.5, and in some examples can be over 1.0. In some embodiments, the methods and structures provided herein can provide a carbide of aluminum material layer within a gate stack for adjusting the effective work function (eWF) of a device having a thickness of less than 25 Å, and in some examples less than 20 Å, and as low as 5 Å. This yields a total workfunction setting electrode thickness comprised of layers of the first metal nitride layer 42 and the carbide of aluminum material layer 43, which can be thinner than 40 Å and as thin as 15 Å. This is not achievable with existing conformal Al-containing material deposited by ALD, such as Ti-containing carbide of aluminum in which the Al atomic percentage is below 30 at. %.

In some embodiments, the conformal Al-containing ALD layers enabling reduction of the eWF. In some embodiments, then aluminum (Al) generates positive charge in the oxide while its diffusion towards the channel is inhibited by the bottom TiN layer, i.e., first metal nitride layer 42, mitigating gate leakage current. The high aluminum (Al) content of the carbide of aluminum material layer 43 provides for a threshold voltage shift for layer thicknesses below 20 Å, that were previously not possible with existing conformal Al-containing material deposited by ALD, such as Ti-containing carbide of aluminum in which the aluminum (Al) atomic percentage is below 30 at. %. The increased aluminum content causes a threshold voltage shift that is suitable for n-type semiconductor devices, e.g., n-type finFETs.

In one example, the aluminum containing carbide layer that provides the effective work function adjusting shift has a composition that is equal to $Al_xC_y$ with trace elements with an x/y ratio of around 1.33, which provides $Al_4C_3$. It is noted that this is only one example of an aluminum and carbon containing composition for provided the aluminum containing carbide layer that produces the effective work function (eWF) shift in accordance with the present disclosure. In other examples, the aluminum containing carbide layer that provides the effective work function adjusting shift has a composition that is equal to $Al_xC_y$ with trace elements with an x/y ratio that ranges from 1.25 to 1.4. In yet other examples, the aluminum containing carbide layer that provides the effective work function adjusting shift has a composition that is equal to $Al_xC_y$ with trace elements with an x/y ratio that ranges from 1.3 to 1.36. In further examples, the aluminum containing carbide layer that provides the effective work function adjusting shift has a composition that is equal to $Al_xC_y$ with trace elements with an x/y ratio that is equal to 1.3, 1.31, 1.32, 1.33, 1.34, 1.35 and 1.36, as well as any range of x/y ratio using one of the aforementioned examples as a lower limit of the range, and one of the aforementioned examples as an upper limit of the range.

It is noted that the carbide of aluminum material layer 43, also referred to as aluminum containing carbide layer, that provides the effective work function (eWF) adjustment in the embodiment depicted in FIG. 4 does not include tantalum (Ta), tungsten (W) or titanium (Ti).

The carbide of aluminum material layer 43 that is depicted in FIG. 4 can be formed using an atomic layer deposition (ALD) method. Similar to the first metal nitrided layer 42, the carbide of aluminum layer 43 is conformally deposited. The carbide of aluminum layer 43 has a conformal thickness on the vertically orientated portions of the first metal nitride layer 42, and has a conformal thickness on the horizontally orientated portions of the first metal nitride layer 42. When viewed from the side-cross sectional view that is depicted in FIG. 4, the geometry of the carbide of aluminum material layer 43 is U-shaped. The thickness of the carbide of aluminum material layer 43 can range from 1 Å to 30 Å. In another embodiment, the aluminum and carbon containing material layer 43 may have a thickness ranging from 5 Å to 20 Å. The carbide of Aluminum layer may be deposited using atomic layer deposition (ALD). For example, the carbide of aluminum layer can be deposited using atomic layer deposition (ALD) using gas precursors produced by formation materials that are selected from a group consisting of $Al(C_xH_{2x+1})_3$, $Al(C_xH_{2x+1})_2H$, $Al(C_xH_{2x+1})_2Cl$, or a combination thereof. The atomic layer deposition (ALD) process may include active species such as hydrogen produced by exciting a reduction gas containing hydrogen. The atomic layer deposition (ALD) process may include a forming temperature greater than 200° C. The carbide of aluminum material layer 43 is a non-graded aluminum (Al) containing layer with carbon, which is not mixed with another metal, such as tantalum (Ta) or titanium (Ti).

Referring to FIG. 4, the second metal nitride layer 44 is formed in direct contact with the carbide of aluminum material layer 43. In one example, the second metal nitride layer 44 is composed of titanium nitride (TiN). Although titanium nitride (TiN) is one example of a metal nitride composition for the second metal nitride layer 44, the methods and structures described herein are not limited to only this composition. For example, the second metal nitride 44 may also be composed of tantalum nitride (TaN), tungsten nitride (WN) and combinations thereof, which include combinations with titanium nitride (TiN).

The second metal nitride layer 44 is a conformally deposited layer. For example, the portions of the second metal nitride layer 44 that are present at the base of the gate opening are horizontally orientated, and have a substantially same thickness as the portions of the second metal nitride layer 44 that present on the vertically orientated portions of the first metal nitride layer 42 that are present on the gate sidewall spacer 26. The second metal nitride layer 44, e.g., second titanium nitride layer, may have a thickness ranging from 10 Å to 40 Å. In another embodiment, the second metal nitride layer 44, e.g., second titanium nitride layer, may have a thickness ranging from 10 Å to 30 Å. In yet another embodiment, the second metal nitride layer 44, e.g., second titanium nitride layer, may have a thickness ranging from 15 Å to 25 Å. The second metal nitride layer 44, e.g., second titanium nitride layer, may be deposited using atomic layer deposition (ALD). For example, the second metal nitride layer 44, e.g., titanium nitride layer (TiN), can be deposited using atomic layer deposition (ALD) using gas precursors comprised of $TiCl_4$—$NH_3$ precursors at a temperature ranging from 350° C. to 450° C.

The embodiment that is depicted in FIG. 4 includes a tri-layer of a conformal first metal nitride layer 42, a conformal carbide of aluminum material layer 43, and a conformal second metal nitride layer 44, in which each layer in the tri-layer has a U-shaped geometry when viewed from the cross-sectional view that is depicted in FIG. 4. The tri-layer does not fill the entirety of the gate opening that is formed by removing the sacrificial gate structure. In the embodiment depicted in FIG. 4, a metal fill 45 is deposited into direct contact with the second metal nitride layer 44. The metal fill 45 is deposited to fill the remaining space of the gate opening that is not filled with the tri-layer of the first metal nitride layer 42, the carbide of aluminum material layer 43 and the second metal nitride layer 44. In some embodiments, the metal fill 45 is a metal, where the metal may be tungsten (W), tungsten nitride (WN) or combinations thereof. In one or more embodiments, the metal fill 45 is tungsten (W). In some other embodiment the metal fill 45 is a metal-nitride, such as TiN. In yet another embodiment, the metal fill is a multi-layer film composed both of metal-nitride and pure metal. The metal fill 45 may be deposited by CVD, e.g., plasma enhanced chemical vapor deposition (PECVD). In some embodiments, a planarization process, such as chemical mechanical planarization (CMP) is applied to the upper surface of the metal fill 45.

In some embodiments, the gate metal length L1 of the gate structure depicted in FIG. 4 may range from 4 nm to 25 nm. In one example, the metal gate length L1 of the gate structure depicted in FIG. 4 may range from 10 nm to 25 nm.

In one example of the embodiment that is depicted in FIG. 4, the functional gate structure that provides the effective work function (eWF) adjustments includes a high-k gate dielectric of hafnium oxide (HfO$_2$), a first metal nitride layer of titanium nitride (TiN), an aluminum and carbon material layer of aluminum carbide (Al$_4$C$_3$), a second metal nitride layer of titanium nitride (TiN), and a metal fill composed of tungsten (W). In some embodiments, the functional gate structure that provides the effective work function (eWF) adjustments and includes the carbide of aluminum material layer, e.g., aluminum carbide (Al$_4$C$_3$), allows for the electrode work function to be tuned from 3.9 to 5.0 eV by adjusting TiN and AlC thickness. The workfunction setting electrode thickness (layers 42, 43) of the functional gate structure that is depicted in FIG. 4 can be as low as 10 Å (as opposed to 30 Å) due to the Al$_4$C$_3$-containing layer being 5 Å to 20 Å.

In some embodiments, having a thinner tri-layer work function metal stack prevents film closure and structurally enables metal fill in all voided area of the Fin containing structure after dummy gate removal both along the source/drain regions or perpendicular to the fin structures. This results in the unique benefit of added metal-fill thickness compared to a stack with a workfunction setting electrode composed of an Al-containing layer which needs to be thicker in order to reach the desired workfunction. The present invention indeed allows for lower gate access resistance at a given metal-gate length.

It is noted that the gate structure depicted in FIG. 4 may be employed for the gate structure to for an n-type semiconductor device, e.g., n-type FinFET, in an n-type device region of a CMOS device; may be employed for the gate structure to for a p-type semiconductor device, e.g., p-type FinFET, in a p-type device region of a CMOS device; or may be employed for the gate structure of both n-type and p-type semiconductor devices, e.g., n-type and p-type FinFETs, that are simultaneously situated on a same substrate. To provide for independent placement of the gate structure depicted in FIG. 4 in a single device region the replacement gate process may employ block masks to selectively remove sacrificial gate structures to provide gate openings solely in the regions of the substrate, in which the gate structures is to be formed, as described with reference to FIGS. 1-3.

Figure 5:
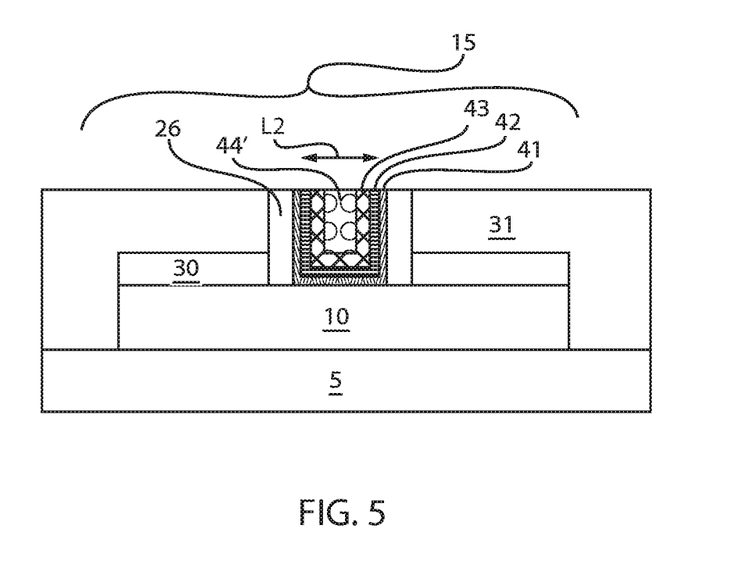
FIG. 5 is a side cross-sectional view of a replacement metal gate structure having a lesser gate length than the replacement gate structure depicted in FIG. 4, in which the replacement gate structure includes a gate stack of a high-k gate dielectric atop a semiconductor channel, a first metal nitride layer atop the high-k gate dielectric, a carbide of aluminum material layer atop the first metal nitride layer, and a metal fill of a second metal nitride atop the carbide of aluminum material layer.

FIG. 5 depicts one embodiment of a replacement metal gate structure having a lesser gate metal length L2 than the replacement gate structure depicted in FIG. 4 due to the absence of metal-fill above the metal-nitride layer. Similar to the replacement gate structure that is depicted in FIG. 4, the replacement gate structure depicted in FIG. 5 includes a carbide of aluminum material layer 43 that provides for effective work function (eWF) adjustments in semiconductor devices without employing channel dopants. The replacement gate structure that is depicted in FIG. 5 does not include a metal fill 45. In the replacement gate structure that is depicted in FIG. 5, the entirety of the gate opening that is formed by removing a sacrificial gate structure as part of a replacement gate process if filled with a material stack including a high-k gate dielectric layer 41, a first metal nitride layer 42, an carbide of aluminum material layer 43 and a second metal nitride layer 44'. In the embodiment that is depicted in FIG. 5 each of the aforementioned layers are conformally deposited layers. The second metal nitride layer 44' provides the finally deposited layer that fills the gate opening. As depicted in FIG. 5, the second metal nitride layer 44' is positioned substantially at a center of the gate opening.

Each of the high-k gate dielectric layer 41, the first metal nitride layer 42, the carbide of aluminum containing material layer 43 and the second metal nitride layer 44' of the replacement gate structure that is depicted in FIG. 5 is similar each of the high-k gate dielectric layer 41, the first metal nitride layer 42, the carbide of aluminum material layer 43 and the second metal nitride layer 44' of the replacement gate structure that is depicted in FIG. 4. Therefore, the above description for each of the high-k gate dielectric layer 41, the first metal nitride layer 42, the carbide of aluminum material layer 43 and the second metal nitride layer 44' of the replacement gate structure that is depicted in FIG. 5. Therefore, the description of the gate dielectric layer 41 that is depicted in FIG. 4 is suitable for describing at least one embodiment of the gate dielectric layer 41 that is depicted in FIG. 5. For example, the gate dielectric layer 41 may be a high-k dielectric layer that is composed of hafnium oxide (HfO$_2$) that has a conformal thickness ranging from 10 Å to 30 Å and have a U-shaped cross sectional geometry. Further, the description of the first metal nitride layer 42 that is depicted in FIG. 4 is suitable for provided the description of at least one embodiment of the first metal nitride layer 42 that is depicted in FIG. 5. For example, the first metal nitride layer 42 may be a conformally deposited layer composed of titanium nitride. The first metal nitride 42 depicted in FIG. 5 may be formed using atomic layer deposition (ALD), may have a thickness ranging from 10 Å to 30 Å, and may have a U-shaped geometry when viewed from a side cross-sectional view.

Still referring to FIG. 5, the carbide of aluminum material layer 43 is formed directly on the first metal nitride layer 42. The carbide of aluminum material layer 43 that is depicted in FIG. 5 is similar to the carbide of aluminum material layer 43 that is depicted in FIG. 4. Therefore, the description of the aluminum (Al) and carbon (C) containing material layer 43 that is depicted in FIG. 4 is suitable for describing at least one embodiment of the aluminum and carbon containing layer 43 that is depicted in FIG. 5. For example, the carbide of aluminum material layer 43 that is a component of the gate structure depicted in FIG. 5 may be a conformally deposited layer formed using atomic layer deposition (ALD) directly on the first metal nitride layer 42. In one example, the carbide of aluminum material layer 43 may be an aluminum carbide containing material that has a conformal thickness ranging from 5 Å to 20 Å with a U-shaped geometry, as depicted in FIG. 5. In one example, the carbide of aluminum material layer 43 is composed of aluminum carbide having the stoichiometry of Al$_4$C$_3$.

The second metal nitride layer 44' that is depicted in FIG. 5 fills the remainder of the gate opening that is not occupied by the gate dielectric 41, the first metal nitride layer 42, and the carbide of aluminum material layer 43. By filling the remainder of the gate opening, the second metal nitride layer 44' of the gate structure depicted in FIG. 5 does not have a U-shaped geometry, which is the geometry of the second metal nitride layer 44' of the gate structure that is depicted in FIG. 4. Although the second metal nitride layer 44' that is depicted in FIG. 5 does not have a U-shaped geometry, the composition and method of forming the second metal nitride layer 44' that is depicted in FIG. 5 is similar to the composition and method of forming the second metal nitride layer 44' that is depicted in FIG. 4. For example, the second metal nitride layer 44' can be composed of titanium nitride (TiN), and can be formed using atomic layer deposition (ALD). The thickness of the second metal nitride layer 44' may have a thickness ranging from 10 Å to 30 Å.

The embodiment that is depicted in FIG. 5 can provide a gate structure having a reduced metal gate length L2 when compared to the metal gate length L1 of the gate structure of the embodiment depicted in FIG. 4. For example, the gate length L2 of the gate structure depicted in FIG. 5 may range from 4 nm to 25 nm. In some examples, the gate length L2 of the gate structure depicted in FIG. 5 may range from 4 nm to 10 nm. In one example, the gate length L2 of the gate structure depicted in FIG. 5 may provide a minimum gate length L2, which can be equal to 2× the thickness of the first metal nitride 42, 2× the thickness of the carbide of aluminum material layer 43, and 1× the thickness of the second metal nitride layer 44'. In one example, the minimum gate length L2 of the gate structure depicted in FIG. 5 is equal to 4 nm.

In one example of the embodiment that is depicted in FIG. 5, the functional gate structure that provides the effective work function (eWF) adjustments and includes the carbide of aluminum material layer, e.g., aluminum carbide ($Al_4C_3$), allows for the electrode work function to be tuned from 3.9 to 5.0 eV (as opposed to 3.9 to 4.2 eV) by adjusting TiN and AlC thickness. The electrode thickness of the functional gate structure composed of the bottom metal-nitride 42 and the carbide of Aluminum (Al) layer 43 that is depicted in FIG. 4 can be as low as 10 Å (as opposed to 30 Å) due to the AlC layer being 5 Å to 20 Å. In some embodiments, having a thinner workfunction metal stack prevents film closure and structurally enables metal fill in all voided area of the Fin containing structure after dummy gate removal both along the source/drain regions or perpendicular to the fin structures.

It is noted that the gate structure depicted in FIG. 5 may be employed for the gate structure to for an n-type semiconductor device, e.g., n-type FinFET, in an n-type device region of a CMOS device; may be employed for the gate structure to for a p-type semiconductor device, e.g., p-type FinFET, in a p-type device region of a CMOS device; or may be employed for the gate structure of both n-type and p-type semiconductor devices, e.g., n-type and p-type FinFETs, that are simultaneously situated on a same substrate. To provide for independent placement of the gate structure depicted in FIG. 5 in a single device region, the replacement gate process may employ block masks to selectively remove sacrificial gate structures to provide gate openings solely in the regions of the substrate, in which the gate structures is to be formed, as described with reference to FIGS. 1-3.

Figure 6:
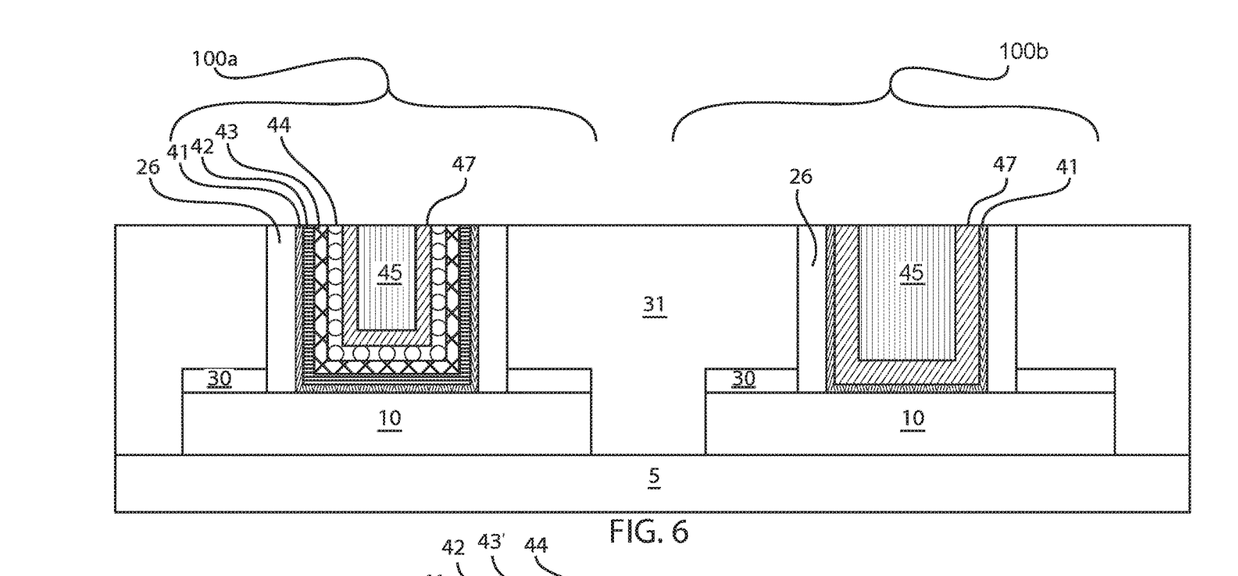
FIG. 6 is a side cross-sectional view depicting a gate structure stack for n-type work function adjustments including a carbide of aluminum material layer to an n-type semiconductor device; and a p-type gate structure stack to a p-type semiconductor device, in accordance with the present invention.

FIG. 6 depicts one embodiment of the present disclosure including an n-type semiconductor device including an n-type gate structure 100a for n-type work function adjustments including a carbide of aluminum material layer 43; and a p-type semiconductor device including a p-type gate structure stack 100b for p-type work function adjustments. The n-type gate structure 100a may be provided by any of the aforementioned gate stacks that have been described with respect to FIGS. 4 and 5. For example, the n-type gate structure 100a may include a gate dielectric layer 41 composed of hafnium oxide ($HfO_2$), a first metal nitride 42 of titanium nitride (TiN), a carbide of aluminum material layer 43 of aluminum carbide ($Al_4C_3$), a second metal nitride 44 of titanium nitride (TiN), and a metal fill 45 composed of tungsten (W). FIG. 6 depicts a structure resulting from n-FET first scheme in which the n-FET workfunction electrode is deposited first and the p-FET workfunction is deposited second. The n-FET has both electrodes and the p-FET only the p-FET workfunction electrode, since the sacrificial n-FET workfunction was selectively removed at p-FET channels. Further details for this material stack are provided in the description of FIG. 4.

Although FIG. 6 depicts an n-type gate structure 100a including a metal fill 45, embodiments including both n-type and p-type semiconductor devices 100a, 100b on the same substrate are not limited to only this example. For example, a gate structure that does not include the metal fill 45, but is composed of only a stack of a first metal nitride layer 42, a carbide of aluminum material layer 43, and a second metal nitride layer 42, as described with reference to FIG. 5 may be employed for the n-type stack of the n-type semiconductor device 100a that is depicted in FIG. 6.

The p-type semiconductor device 100a may include a p-type work function metal layer 47 to provide an effective work function shift for p-type semiconductor devices. As used herein, a "p-type work function metal layer" is a metal layer that effectuates a p-type threshold voltage shift. As used herein, "threshold voltage" is the lowest attainable gate voltage that will turn on a semiconductor device, e.g., transistor, by making the channel of the device conductive. The term "p-type threshold voltage shift" as used herein means a shift in the Fermi energy of a p-type semiconductor device towards a valence band of silicon in the silicon containing substrate of the p-type semiconductor device. A "valence band" is the highest range of electron energies where electrons are normally present at absolute zero. In some embodiments, the p-type work function metal layer 47 is provided by titanium nitride, titanium aluminum nitride, tungsten nitride, tantalum nitride, and combinations thereof.

In the embodiment that is depicted in FIG. 6, the n-type semiconductor device 100a includes an n-type gate structure that includes a first material stack including a carbide of aluminum material layer 43 that provides an n-type effective work function shift that is in direct contact with the channel region of the n-type semiconductor device, and the n-type gate structure 100a includes a second material stack including a material layer for a p-type work function metal layer 47 is present atop the first material stack. Still referring to FIG. 6, the p-type semiconductor device 100b includes a p-type gate structure that includes only the p-type work function metal layer 47 for adjusting the work function of the p-type semiconductor device 100b, and a metal fill 48. The metal fill 48 that fills the gate opening for the p-type semiconductor device 100b is also present filling a remainder of the gate opening atop the p-type work function metal layer in the n-type gate structure of the n-type semiconductor device 100a. The presence of the p-type gate materials in the n-type gate structure of the n-type semiconductor device 100a results from a replacement metal gate process that employs block masks as described with reference to FIGS. 1-2. For example, the material layers for the n-type gate structure are first formed in the gate openings to both the n-type and p-type semiconductor devices 100a, 100b. Thereafter, a block mask is formed over the n-type semiconductor device 100a, and the material layers for the n-type gate structure that are deposited in the gate opening to the p-type semiconductor device 100b is removed using a selective etch. In a following step, the block mask is removed, and the material layers for the p-type gate structure to the p-type semiconductor device is formed in both gate openings providing the structure depicted in FIG. 6. It is noted that this is only one example of a replacement gate flow process that is suitable for use with the methods and structures described herein.

Referring to FIG. 6, in one embodiment, the n-type gate structure to the n-type semiconductor device can include a high-k gate dielectric 41 composed of hafnium oxide (HfO$_2$), a first metal nitride layer 42 composed of titanium nitride (TiN), a carbide of aluminum material layer 43 composed of aluminum carbide (Al$_4$C$_3$), and a second metal nitride 44 that is composed of titanium nitride (TiN). This material stack can be referred to as the first material stack within the gate opening to the n-type semiconductor device 100a. Further details for each of the aforementioned material layers are provided above in the description of the material layers having the same reference numbers as described above with reference to FIGS. 4 and 5. Atop the first material stack in the gate opening to the n-type semiconductor device 100a is the second material stack that includes the p-type work function metal layer 47 and the metal fill 48. The p-type work function metal layer 47 can be composed of titanium nitride (TiN), and the metal fill 48 may be composed of tungsten (W). The metal fill 48 that is depicted in FIG. 6 is similar to the metal fill 45 that is described above with reference to FIG. 4. Therefore, the above description of the metal fill 45 that is provided for the structure depicted in FIG. 4 is suitable for describing one embodiment of the metal fill 48 that is depicted in FIG. 6.

Referring back to FIG. 6, the gate opening for the p-type gate structure to the p-type semiconductor device is filled solely with the p-type work function metal layer 47 and the metal fill 48. The p-type work function metal layer 47 may be composed of metal nitride, such as titanium nitride (TiN), that is deposited using atomic layer deposition and/or chemical vapor deposition. The p-type work function metal layer 47 may have a conformal thickness that can range from 10 Å to 30 Å, and when viewed from the side cross-section illustrated in FIG. 6, the p-type work function metal layer 47 can have a U-shaped geometry. The metal fill 48 that is depicted in FIG. 6 is similar to the metal fill 45 that is described above with reference to FIG. 4. Therefore, the above description of the metal fill 45 that is provided for the structure depicted in FIG. 4 is suitable for describing one embodiment of the metal fill 48 that is depicted in FIG. 6.

Figure 7:
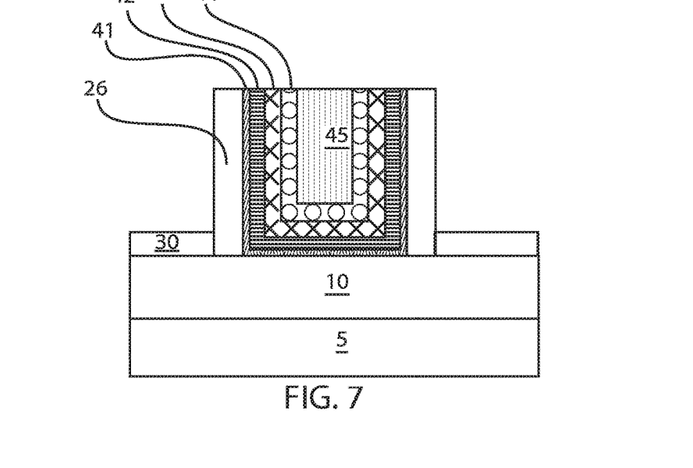
FIG. 7 is a side cross-sectional view depicting one embodiment of a replacement gate structure including a composite material including a carbide of aluminum in a stack of gate layers that provides a work function adjustment, in accordance with one embodiment of the present invention.

FIG. 7 depicts one embodiment of a replacement gate structure including a composite carbide of aluminum material containing layer 43' in a stack of gate layers that provides a work function adjustment. The composite carbide of aluminum material containing layer 43' includes at least an aluminum (Al) rich component of aluminum carbide, e.g., Al$_4$C$_3$, in combination with other aluminum containing materials, such as titanium aluminum carbon (TiAl(C)) and titanium aluminum nitride (TiAl(N)). In some embodiments, the composite carbide of aluminum containing material layer 43' is formed from atomic layer deposition (ALD) deposited metal-material/composite using less potent aluminum (Al) containing films in addition to aluminum carbide, e.g., Al$_4$C$_3$, titanium aluminum carbon (TiAl(C)) and titanium aluminum nitride (TiAl(N)) to fine tune the aluminum (Al) profile and the stack properties, while maintaining a thickness consistent with the previously described embodiments. In some embodiments, the effective atomic Al content of the mixed material for the composite aluminum (Al) and carbon (C) containing layer 43' containing layer can be tuned between 30 at. % and 57 at. %. This offers a means other than thickness for tuning of the electrode workfunction layer by adjustment of the Al-content above value typically achievable using other aluminum containing materials, such as titanium aluminum carbon (TiAl(C)) and titanium aluminum nitride (TiAl(N)) on their own without addition of Al$_4$C$_3$. Therefore, the thickness of Al$_4$C$_3$-containing stacks will be thinner than when it is not present, allowing for similar benefits of metal gate length scaling and reduction of gate access resistance.

Referring to FIG. 7, the composite carbide of aluminum containing layer 43' may be deposited in an atomic layer deposition (ALD) sequence of a first metal nitride layer 42, the composite carbide of aluminum containing material layer 43', and the second metal nitride layer 44. The Ti-containing carbide of aluminum layer 43' can be obtained by an atomic layer deposition (ALD) process in which consecutive layers of individual materials such as Al$_4$C$_3$, (TiAl(C)) or (TiAl(N)) are deposited in a cycle sequence aimed at reaching the target Al content. The precursors and gases used to deposit single layers of (TiAl(C)) or (TiAl(N)) include for example TiCl$_4$, NH$_3$, Al(C$_x$H$_{2x+1}$)$_3$, Al(C$_x$H$_{2x+1}$)$_2$H, Al(C$_x$H$_{2x+1}$)$_2$Cl, or a combination thereof. The deposition temperature is typically above 200° C. and below 450° C. The first and second metal nitride layer 42, 44 that are depicted in FIG. 7 are similar to the first and second metal nitride layer 42, 44 that are depicted in FIGS. 4 and 5. Therefore, the above description of the first and second metal nitride layer 42, 44 that are described with reference to FIGS. 4 and 5 can provide the description of one embodiment of the first and second metal nitride layers 42, 44 for the embodiment depicted in FIG. 7. For example, the first and second metal nitride layers 42, 44 depicted in FIG. 7 may be composed of titanium nitride (TiN). The structure depicted in FIG. 7 may further include a metal fill 45, which has been described above with to the prior embodiments of the present disclosure.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Having described preferred embodiments of a dual channel silicon/silicon germanium complementary metal oxide semiconductor performance with interface engineering (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims.

What is claimed is:

1. A gate structure for effective work function adjustments of a semiconductor device comprising:
    a gate dielectric on a channel region of the semiconductor device; and
    a workfunction setting electrode comprising a first metal nitride in direct contact with the gate dielectric, a conformal carbide of aluminum material layer comprising $Al_4C_3$ in combination with a titanium and aluminum containing carbide, a titanium and aluminum containing nitride, or a combination with both said titanium and aluminum containing carbide and said titanium and aluminum containing nitride, and a second metal nitride in direct contact with the conformal carbide of aluminum material layer.

2. The gate structure of claim 1, wherein the conformal carbide of aluminum material layer is a non-graded carbide with an aluminum (Al) content of 57 atomic percent (at. %).

3. The gate structure of claim 1, wherein the conformal carbide of aluminum material layer has a thickness tuned between 5 Å and 20 Å.

4. The gate structure of claim 1, wherein the conformal carbide of aluminum material layer adjusts the work function of the electrode to be between 3.9 eV and 5.0 eV.

5. The gate structure of claim 1, wherein the first metal nitride is comprised of titanium nitride.

6. The gate structure of claim 1, wherein the second metal nitride is comprised of titanium nitride.

7. The gate structure of claim 1, further comprising a low resistivity metal fill atop of the second metal nitride.

8. A gate structure for effective work function adjustments of a semiconductor device comprising:
    a gate dielectric on a channel region of the semiconductor device; and
    a workfunction setting electrode comprising a first metal nitride in direct contact with the gate dielectric, a conformal carbide of aluminum material layer that has a composition of $Al_4C_3$ and a thickness that is less than 25 Å, and a second metal nitride in direct contact with the conformal carbide of aluminum material layer.

9. A semiconductor device comprising:
    source and drain regions on opposing sides of a channel region of the semiconductor device; and
    a gate structure comprising a gate dielectric on the channel region of the semiconductor device and a workfunction setting electrode comprising a first metal nitride in direct contact with the gate dielectric, a conformal carbide of $Al_4C_3$ having a thickness that is less than 25 Å, and a second metal nitride in direct contact with the conformal carbide of $Al_4C_3$.

10. The semiconductor device of claim 9, wherein the gate structure has a gate length below 25 nm.

11. The semiconductor device of claim 9, wherein the workfunction setting electrode, excluding the second metal nitride, has a thickness ranging between 10 Å and 40 Å.

12. The semiconductor device of claim 9, wherein the conformal carbide has a thickness tuned between 5 Å and 20 Å.

13. The semiconductor device of claim 9, wherein the conformal carbide of $Al_4C_3$ adjusts the work function of the electrode to be between 3.9 eV and 5.0 eV.

14. The semiconductor device of claim 9 further comprising a gap fill atop the second metal nitride comprising a metal, a metal-nitride or a combination thereof.

* * * * *